(12) United States Patent
Choi et al.

(10) Patent No.: US 7,419,879 B2
(45) Date of Patent: Sep. 2, 2008

(54) TRANSISTOR HAVING GATE DIELECTRIC LAYER OF PARTIAL THICKNESS DIFFERENCE AND METHOD OF FABRICATING THE SAME

(75) Inventors: Byung-yong Choi, Suwon-si (KR);
Chang-woo Oh, Suwon-si (KR);
Dong-gun Park, Seongnam-si (KR);
Dong-won Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 110 days.

(21) Appl. No.: 11/329,623

(22) Filed: Jan. 11, 2006

(65) Prior Publication Data

US 2006/0154410 A1      Jul. 13, 2006

(30) Foreign Application Priority Data

Jan. 12, 2005    (KR)    .................... 10-2005-0002877
Feb. 24, 2005    (KR)    .................... 10-2005-0015272

(51) Int. Cl.
*H01L 21/336* (2006.01)
(52) U.S. Cl. ................ 438/283; 438/304; 257/E21.179
(58) Field of Classification Search ................ 438/283, 438/304; 257/E21.179, E21.176, E21.177, 257/E21.625
See application file for complete search history.

(56) References Cited

U.S. PATENT DOCUMENTS

| | | | |
|---|---|---|---|
| 5,290,720 A * | 3/1994 | Chen | ................. 438/304 |
| 5,358,879 A * | 10/1994 | Brady et al. | ................. 438/163 |
| 5,600,168 A * | 2/1997 | Lee | ................. 257/336 |
| 6,784,483 B2 | 8/2004 | Chen | ................. 257/317 |
| 6,806,517 B2 | 10/2004 | Kim et al. | |
| 6,911,691 B2 | 6/2005 | Tomiie et al. | ................. 257/324 |
| 6,967,143 B2 * | 11/2005 | Mathew et al. | ................. 438/304 |
| 7,217,624 B2 * | 5/2007 | Lim et al. | ................. 438/302 |
| 2004/0026733 A1 | 2/2004 | Tomiie et al. | ................. 257/315 |
| 2004/0135212 A1 | 7/2004 | Dokumaci et al. | ................. 257/376 |
| 2004/0183106 A1 | 9/2004 | Kim et al. | |

FOREIGN PATENT DOCUMENTS

| | | |
|---|---|---|
| JP | 2003-051558 | 2/2003 |
| KR | 10-2003-0013624 | 2/2003 |
| KR | 10-2003-0051038 | 6/2003 |
| KR | 10-2004-0082018 | 9/2004 |
| WO | 02/099893 | 12/2002 |

* cited by examiner

*Primary Examiner*—Lex Malsawma
(74) *Attorney, Agent, or Firm*—Mills & Onello LLP

(57) ABSTRACT

A transistor having a gate dielectric layer of partial thickness difference and a method of fabricating the same are provided. The method includes forming a gate dielectric layer having a main portion with a relatively thin thickness formed on a semiconductor substrate, and a sidewall portion with a relatively thick thickness formed on both sides of the main portion. A first gate is formed overlapping the main portion of the gate dielectric layer, and forming a second gate layer covering the sidewall portion of the gate dielectric layer and covering the first gate. The second gate layer is etched, thereby forming second gates patterned with a spacer shape on sidewalls of the first gate. The exposed sidewall portion of the gate dielectric layer is selectively etched using the second gates as a mask, thereby forming a pattern of the gate dielectric layer to be aligned with the second gates. A source/drain is formed in a portion of the semiconductor substrate exposed by the second gates.

23 Claims, 16 Drawing Sheets

TRANSISTOR HAVING GATE DIELECTRIC LAYER OF PARTIAL THICKNESS DIFFERENCE AND METHOD OF FABRICATING THE SAME

CROSS-REFERENCE TO RELATED PATENT APPLICATION

This application claims the benefit of Korean Patent Application Nos. 10-2005-0002877, filed on Jan. 12, 2005, and 10-2205-0015372, filed on Feb. 24, 2005, in the Korean Intellectual Property Office, the contents of which are incorporated herein in their entirety by reference.

BACKGROUND OF THE INVENTION

1. Field of the Invention

The present invention relates to a semiconductor device, and more particularly, to a field effect transistor having a gate dielectric layer of partial thickness difference and a method of fabricating the same.

2. Description of the Related Art

The recent rapid development of semiconductor technology has been achieved based on the scaling down of field effect-transistors. The scaling down of devices results in the increase of integration degree and improvement of device performance, but also results in undesirable problems due to the scaling down of devices, such as the increase of short channel effects, and the increase of a leakage current, for example, gate leakage current, a drain leakage current, and the like. For these reasons, many efforts have been made on studies to solve the problems involved with the scaling down of devices.

As one method to solve the problems due to the scaling down of devices, there have been proposed a transistor having a gate dielectric layer of partial thickness difference or a notched gate transistor. The notched gate transistor reduces a Miller capacitance interfering with high speed operation of devices, reduces a leakage current from source/drain to a gate, and provides a pocket ion implantation profile successfully so as to improve a short channel effect.

The effects of the notched gate transistor as above result from its structural characteristics, in which a dielectric layer on a channel has a relatively thin thickness, and a dielectric layer on source/drain generating a leakage current has a relatively thick thickness, thereby providing advantages by the scaling down of devices. A method of forming the notched gate transistor requires performing a partial etch process for a gate material. However, the etch process may cause many problems in connection with the scaling down of devices. Therefore, it is required to develop methods of forming a field effect transistor having a gate dielectric layer of partial thickness difference more effectively.

FIGS. 1 through 3 are schematic sectional views illustrating a method of fabricating a conventional transistor having a notched gate.

Referring to FIG. 1, the conventional transistor having a notched gate is formed by processes including forming a relatively thin gate dielectric layer 20 on a semiconductor substrate 10, and forming a relatively thin first gate layer 31 and a relatively thick second gate layer 35 on the gate dielectric layer 20.

Referring to FIG. 2, the second and first gate layers 35, 31, and the gate dielectric layer 20 are patterned such that the first gate layer 31 is recessed from the sidewalls of the second gate layer 35 and the gate dielectric layer 20, thereby forming a notch or groove shape. Referring to FIG. 3, an insulating layer 40 is formed to fill the notch portion, and spacer-etched, thereby forming a spacer shape. The second gate layer 35 is disposed on an insulating layer portion 41 filling the notch.

Specifically, only the gate dielectric-layer 20 having a relatively thin thickness is disposed between the gates 31, 35 and a channel. Between a portion of the gate 35 on a source 51 and a drain 55, and the semiconductor substrate 10, there is disposed a dielectric layer having a relatively thick thickness, that is, the insulating layer portion 41 filling the notch and the gate dielectric layer 20.

The method of fabricating the notched gate transistor includes an operation of partially removing a portion of a gate material, that is, an etch process forming a notch, and the etch process requires precise control for process conditions. However, the precise control for the etch process as above will be presumably difficult to accomplish with the scaling down of devices further developed. Therefore, the approaches used to control the etch process will presumably limit the accomplishment of the scaling down of devices.

Furthermore, a possibility that damage to the lower dielectric layer 20 and the upper second gate layer 35, for example, occurrence of lifting and the like, will be increased in the existing methods of partially removing a gate. Further, difficulties of the occurrence of voids and the like during the process while filling the relevant removed portion, that is, notch portion, will be generated. Therefore, it is required to develop methods of more effectively fabricating the field effect transistor having a gate dielectric layer of partial thickness difference.

SUMMARY OF THE INVENTION

The present invention provides a method of fabricating a field effect transistor having a gate dielectric layer of partial thickness difference, and a transistor structure fabricated thereby.

According to an aspect of the present invention, there is provided a method of fabricating a transistor comprising: forming a gate dielectric layer including a main portion with a relatively thin thickness formed on a semiconductor substrate, and a sidewall portion with a relatively thick thickness formed on both sides of the main portion; forming a first gate overlapping the main portion of the gate dielectric layer; forming a second gate layer covering the sidewall portion of the gate dielectric layer exposed by the first gate, and covering the first gate; etching the second gate layer, thereby forming second gates patterned with a spacer shape on sidewalls of the first gate; selectively etching the exposed sidewall portion of the gate dielectric layer using the second gates as a mask, thereby forming a pattern of the gate dielectric layer to be aligned with the second gates; and forming a source/drain in a portion of the semiconductor substrate exposed by the second gates.

In one embodiment, forming the gate dielectric layer comprises forming a first dielectric layer on the semiconductor substrate; forming a sacrificial layer pattern on the first dielectric layer to have a trench exposing a portion of the first dielectric layer; selectively removing the portion of the first dielectric layer exposed by the trench; and forming a second dielectric layer on a portion of the semiconductor substrate exposed by removing the portion of the first dielectric layer, the second dielectric layer having a thinner thickness than that of the first dielectric layer.

In one embodiment, the method further comprises, before forming the second dielectric layer, selectively etching the exposed portion of the semiconductor substrate using the sacrificial layer pattern as mask, thereby forming a recess groove for a recess channel.

In one embodiment, the first dielectric layer and the sacrificial layer pattern are formed of different insulating materials.

In one embodiment, the sacrificial layer pattern is formed of a silicon nitride layer.

In one embodiment, forming the first gate comprises: forming a first gate layer filling the trench; patterning the first gate layer to expose an upper surface of the sacrificial layer pattern; and selectively removing the sacrificial layer pattern.

In one embodiment, forming the source/drain comprises: performing a first ion implantation on the exposed portion of the semiconductor substrate using the second gates as a mask; forming spacers on sidewalls of the second gates; and performing a second ion implantation on the exposed portion of the semiconductor substrate using the spacers as a mask.

In one embodiment, the method further comprises performing a pocket ion implantation on the exposed portion of the semiconductor substrate using the second gates as a mask.

In one embodiment, the method further comprises performing a self-aligned silicide process of forming electrodes to be connected with the gate and the source/drain.

In accordance with another aspect, of the present invention, there is provided a method of fabricating a transistor comprising: forming a first dielectric layer on a semiconductor substrate; forming a sacrificial layer pattern on the first dielectric layer to have a trench exposing a portion of the first dielectric layer; selectively removing the portion of the first dielectric layer exposed by the trench; forming a second dielectric layer on a portion of the semiconductor substrate exposed by removing the portion of the first dielectric layer, the second dielectric layer having a thinner thickness than that of the first dielectric layer; forming a first gate filling the trench; selectively removing the sacrificial layer pattern exposed by the first gate, thereby exposing a remaining portion of the first dielectric layer; forming a second gate layer covering the exposed first dielectric layer and the first gate; etching the second gate layer, thereby forming second gates patterned with a spacer shape on sidewalls of the first gate; selectively etching the exposed portion of the first dielectric layer using the second gates as a mask, thereby forming a pattern of the second dielectric layer to be aligned with the second gates; and forming a source/drain in a portion of the semiconductor substrate exposed by the second gates.

Forming the source/drain may be performed by performing a first ion implantation on the exposed portion of the semiconductor substrate using the second gates as a mask; forming spacers on sidewalls of the second gates; and performing a second ion implantation on the exposed portion of the semiconductor substrate using the spacers as a mask.

Further, the method may include performing a pocket ion implantation on the exposed portion of the semiconductor substrate using the second gates as a mask.

Further, before forming the second dielectric layer, the method may include selectively etching the exposed portion of the semiconductor substrate using the sacrificial layer pattern as mask, thereby forming a recess groove for a recess channel.

Before forming the second dielectric layer, the method may further include forming a third dielectric layer on the exposed semiconductor substrate; performing an ion implantation for threshold voltage ($V_{th}$) control on a portion of the semiconductor substrate below the third dielectric layer; and selectively removing a portion of the third dielectric layer overlapping the semiconductor substrate.

Alternatively, before forming the second dielectric layer, the method may further include forming a third dielectric layer on the exposed semiconductor substrate to extend to cover sidewalls of the sacrificial layer pattern; performing an ion implantation for threshold voltage ($V_{th}$) control on a portion of the semiconductor substrate below the third dielectric layer; and selectively removing a portion of the third dielectric layer overlapping the semiconductor substrate, thereby forming inner spacers on the sidewalls of the sacrificial layer pattern to include the remaining portion of the third dielectric layer.

Before removing the sacrificial layer pattern, the method may further include forming a protecting layer protecting the first gate along with the inner spacers.

Before forming the second gate layer, the method may further include selectively removing the protecting layer and the inner spacers such that the second gate layer is formed on the first gate.

The second gate layer may be formed to extend to cover the protecting layer and the inner spacers.

The method may further include performing a self-aligned silicide process of forming electrodes to be connected with the gates and with the source/drain. Alternatively, the method may further include exposing an upper surface of the gate after forming the source/drain, and selectively removing upper portions of the inner spacers, thereby partially exposing sidewalls of the first and second gates; and performing a self-aligned silicide process of forming a gate electrode to be connected with the first and second gates, and source/drain electrodes to be connected with the source/drain.

The first dielectric layer and the sacrificial layer pattern may be formed of different insulating materials respectively. The sacrificial layer pattern may be formed of a silicon nitride layer.

According to another aspect of the present invention, there is provided a transistor fabricated by the fabrication method as above.

According to another aspect, the invention is directed to a transistor. The transistor includes a semiconductor'substrate and a first dielectric layer formed on the semiconductor substrate. A first gate is formed on the first dielectric layer to overlap the first dielectric layer, and inner spacers are formed on sidewalls of the first gate. Second gates are formed on sidewalls of the first gate with a spacer shape on the inner spacers. A second dielectric layer is formed to be self-aligned with the second gates and has a thicker thickness than that of the first dielectric layer. A source/drain is formed in a portion of the semiconductor substrate exposed by the second gates.

In one embodiment, the transistor further comprises: a gate electrode including a silicide layer connected to the gate; and source/drain electrodes including a silicide layer connected to the source/drain.

In one embodiment, the gate electrode is selectively connected to the first gate, and the first gate is insulated from the second gates by the inner spacers.

In one embodiment, wherein two of the second gates on both sides of the first gate are formed with equal widths to be self-aligned with the first gate.

In one embodiment, the source/drain comprises: a first impurity layer formed by performing an ion implantation process using two of the second gates having equal widths as a mask, a width of the portion of the first impurity layer overlapping the second gates being controlled by the second gates; and a second impurity layer formed by performing an ion implantation process using spacers attached to the second gates as a mask and aligned with the spacers.

In one embodiment, the semiconductor substrate comprises a recess groove to form a recess channel overlapping the first gate. The inner spacers extend to cover sidewalls of the recess groove. The first dielectric layer is disposed at a bottom of the recess groove. The first gate fills the recess groove.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

This application incorporates by reference the entire contents of U.S. patent application Ser. No. 11/329,943, filed on Jan. 11, 2006, assigned to Samsung Electronics Co., Ltd., entitled, "Method of Manufacturing Semiconductor Device Having Notched Gate MOSFET," naming as inventors Byung-yong Choi, Choong-ho Lee, Dong-won Kim and Dong-gun Park.

FIGS. 4 through 13 are schematic sectional views illustrating a method of forming a first gate according to an embodiment of the present invention. In the embodiment of the present invention, the description of the formation of the first gate will be made using an example of patterning using a damascene method. However, it will be understood that a structure of the first gate formed on a relatively thin first dielectric layer can also be formed by employing other modified formation methods.

Figure 1:
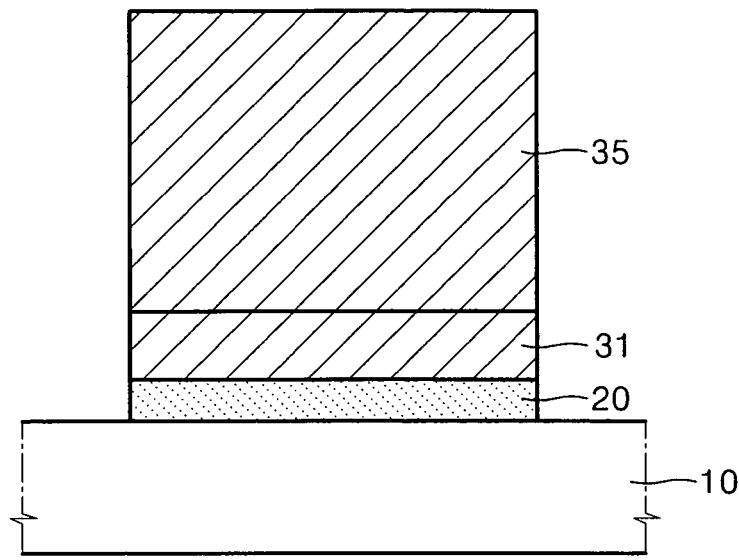
FIGS. 1 through 3 are schematic sectional views illustrating a method of fabricating a conventional transistor having a notched gate.
Figure 2:
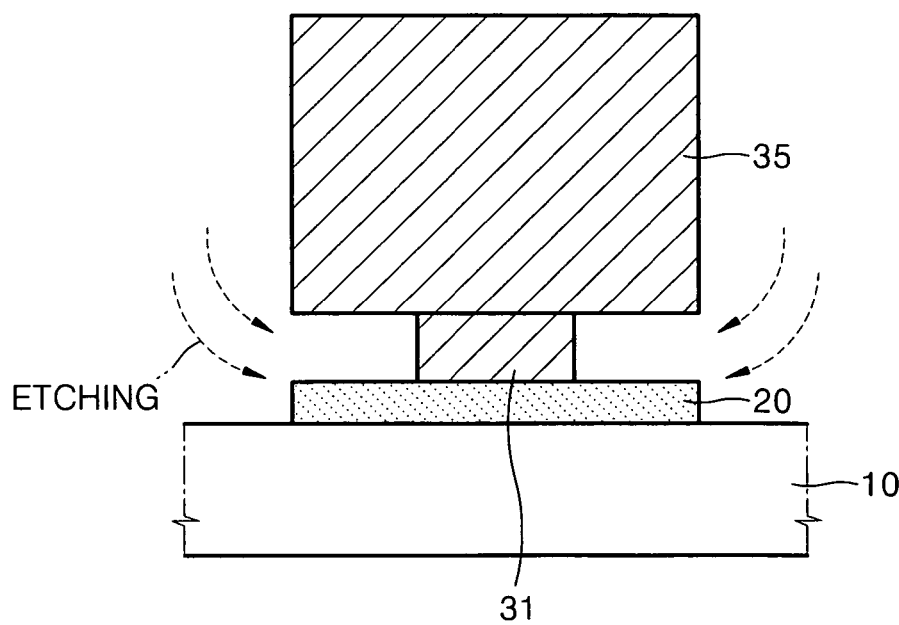
Figure 3:
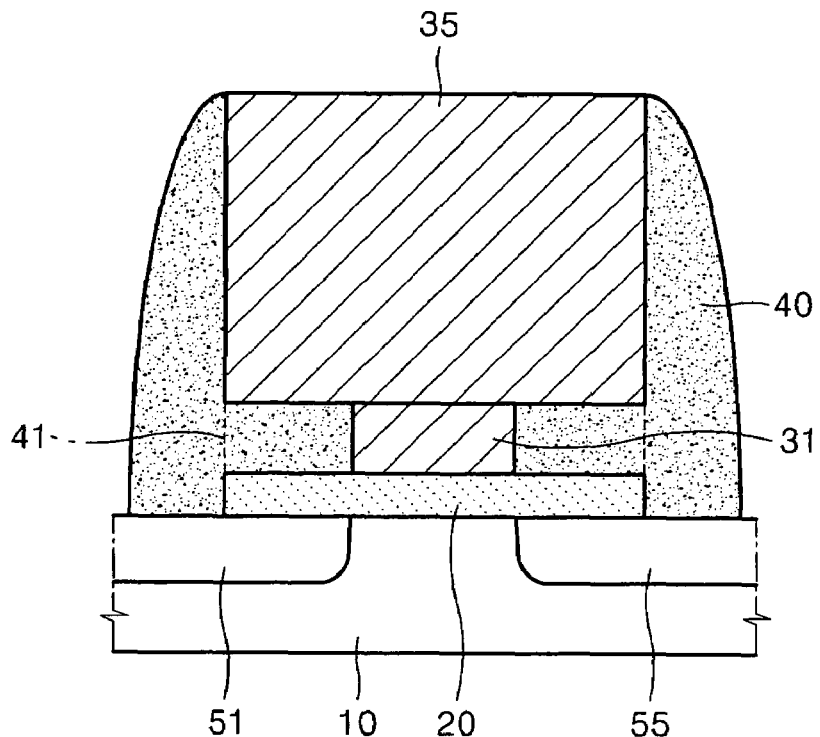
Figure 4:
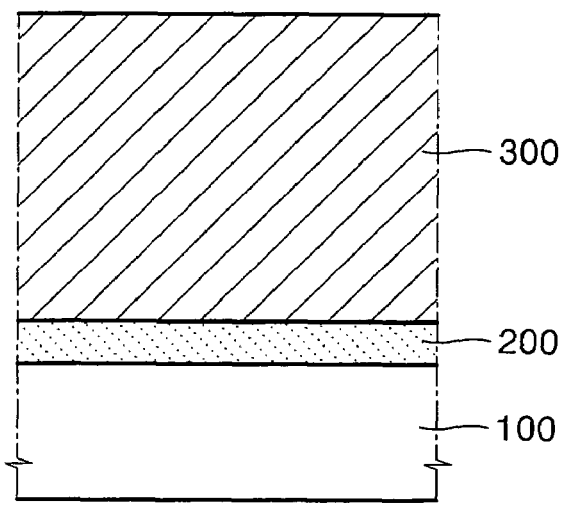
FIGS. 4 through 20 are schematic sectional views illustrating a transistor having a gate dielectric layer of partial thickness difference and a method of fabricating the same according to an embodiment of the present invention.

Referring to FIG. 4, a first dielectric layer 200 and a sacrificial layer 300 are formed on a semiconductor substrate 100. In order to form the first gate of the embodiment of the present invention, the semiconductor substrate 100 is first prepared. The semiconductor substrate 100 may be a substrate being suitable to semiconductor fabrication processes such as a silicon wafer (Si-wafer), a silicon-on-insulator (SOI), or the like.

The first dielectric layer 200 having a thickness that is larger or thicker as compared to a dielectric layer to be formed with a relatively thin or small thickness is formed on the semiconductor substrate 100. The first dielectric layer 200 is introduced to provide a portion to be remaining with a relatively thick thickness adjacent to a source/drain of the transistor. Therefore, the first dielectric layer 200 may be formed of dielectrics suitable to a gate dielectric layer of a transistor, for example, a dielectric such as a silicon oxide layer.

A sacrificial layer 300 is formed on the first dielectric layer 200 to form a damascene pattern for pattering a first gate using a damascene method. Since the sacrificial layer 300 may be selectively removed after the first gate is formed, the sacrificial layer 300 may be formed of an insulating material having an etch selectivity with respect to the first dielectric layer 200, for example, a silicon nitride layer. The thickness of the sacrificial layer 300 may be determined in consideration of a height of the first gate and/or a height of the transistor gate.

Figure 5:
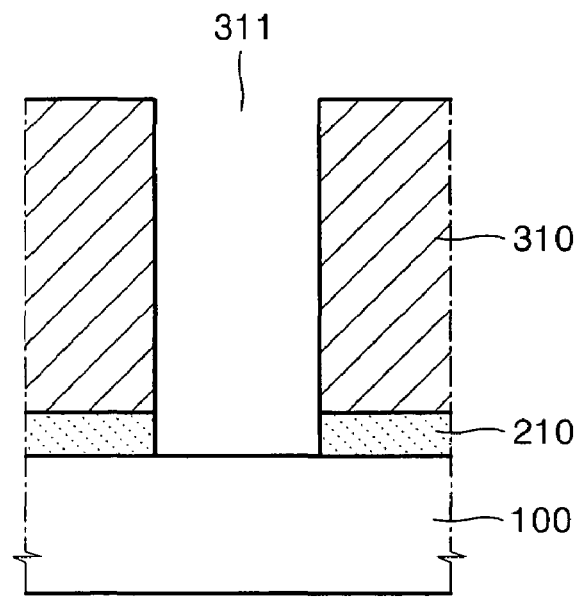

Referring to FIG. 5, the sacrificial layer 300 is patterned, thereby forming a sacrificial layer pattern 310 to form the first gate by a damascene method. The sacrificial layer pattern 310 is formed by selectively opening a portion where the first gate will be formed, and selectively removing the insulating material filling the open portion. The sacrificial layer pattern 310 has a trench 311 filled with the first gate. Since the first gate will be formed to substantially overlap a channel between the source/drain of the transistor, the width of the trench 311 will be determined in consideration of the width of the first gate. The patterning may be performed using a selective etch process including photolithography.

A portion of the first dielectric layer 200 exposed by the formation of the trench 311 of the sacrificial layer pattern 310 is selectively removed, thereby exposing a surface of the semiconductor substrate 100 disposed at the bottom of the trench 311. As a result, the remaining first dielectric layer 210 is patterned to overlap the sacrificial layer pattern 310.

Figure 6:
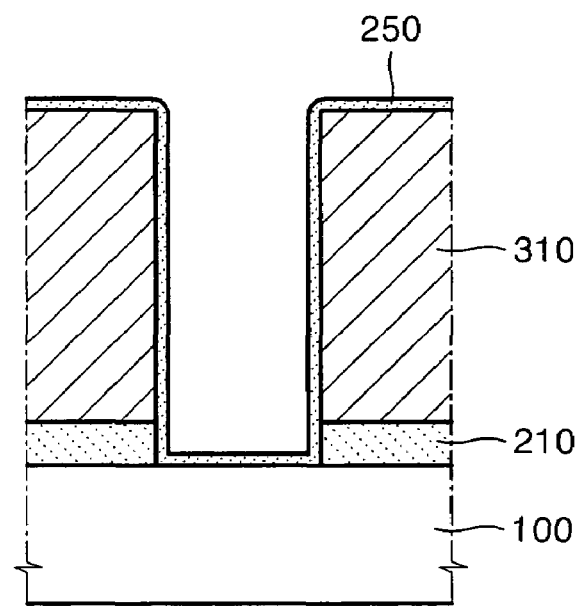

Referring to FIG. 6, a second dielectric layer 250 is formed. The second dielectric layer 250 is formed to cover the semiconductor substrate 100 exposed by the formation of the sacrificial layer pattern 310. The second dielectric layer 250 may be used as an ion implantation pad layer when an ion implantation process is performed on the portion of the semiconductor substrate 100 exposed by the formation of the sacrificial layer pattern 310, that is, the channel of the transistor, in order to control a threshold voltage ($V_{th}$). Thus, the second dielectric layer 250 may be formed of an insulating material or dielectric material layer with a thin thickness in comparison with the first dielectric layer 210, for example, a silicon oxide layer.

The second dielectric layer 250 may be formed to extend to the sidewalls and the upper surface of the sacrificial layer pattern 310.

Figure 7:
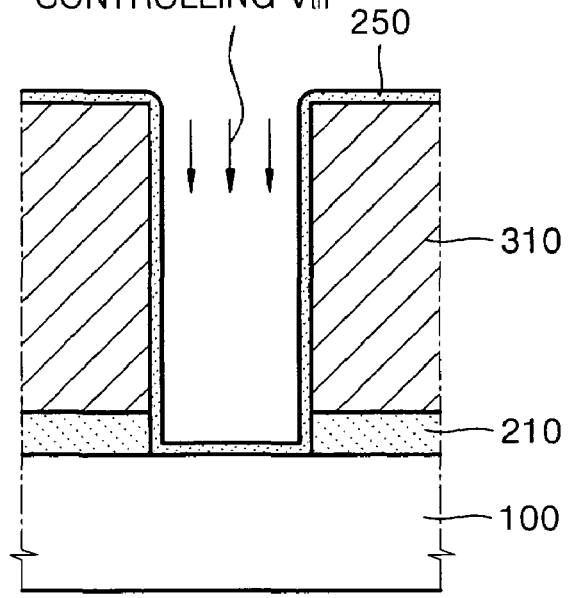

Referring to FIG. 7, an ion implantation process for controlling a threshold voltage ($V_{th}$) is performed on the portion of the semiconductor substrate 100 opened by the sacrificial layer pattern 310. The ion implantation process for controlling a threshold voltage ($V_{th}$) may be performed by a local channel ion implantation.

Figure 8:
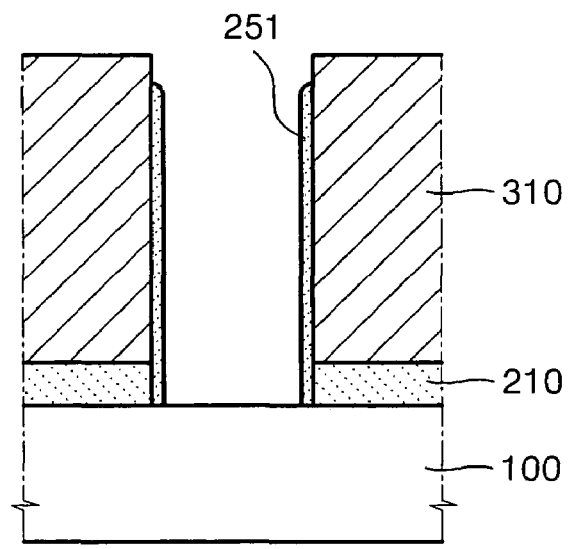

Referring to FIG. 8, the second dielectric layer 250 is removed to expose the surface of the semiconductor substrate 100. A portion of the second dielectric layer 250 covering the semiconductor substrate 100 is etched and removed in order to form a gate dielectric layer on the portion of the semiconductor substrate 100 opened by the sacrificial layer pattern 310, to be disposed below a first gate. The etch process may be performed using an anisotropic dry etch process or the like.

As a result, inner spacers 251 including the remaining portion of the second dielectric layer 250 may be formed on the sidewalls of the sacrificial layer pattern 310.

Figure 9:
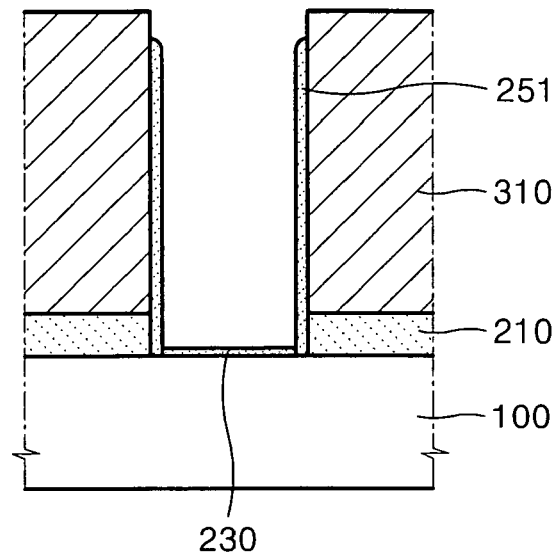

Referring to FIG. 9, a third dielectric layer 230 to be used as a gate dielectric layer is formed on the portion of the semiconductor substrate 100 exposed by the inner spacers 251. Since the third dielectric layer 230 will substantially constitute a main portion of the gate dielectric layer overlapping the channel, the third dielectric layer 230 is formed with a thin thickness in comparison with the first dielectric layer 210. Alternatively, the third dielectric layer 230 may be formed to include an insulating material and/or dielectric material to be used as the gate dielectric layer, for example, a silicon oxide layer. The third dielectric layer 230 may be formed using an oxidation or deposition method.

Figure 10:
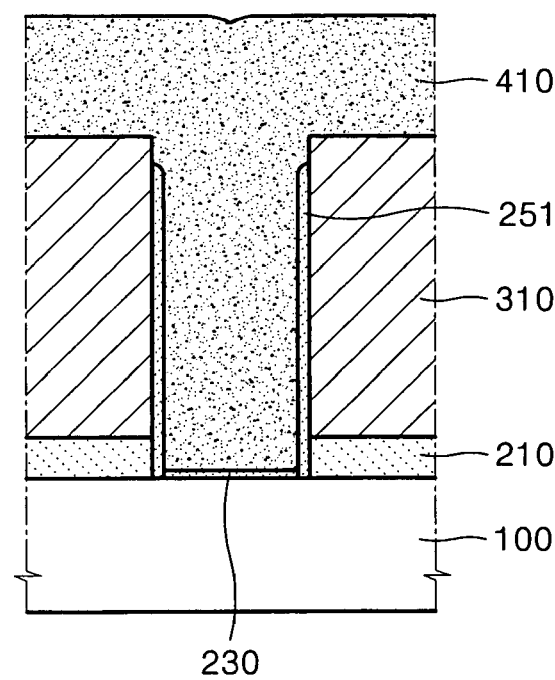

Referring to FIG. 10, a first gate layer 410 is formed to fill a gap between the sacrificial layer pattern 310. The first gate layer 410 may be formed on the third dielectric layer 230, and may include a conductive material to form the first gate, for example, conductive polysiliconor the like.

Figure 11:
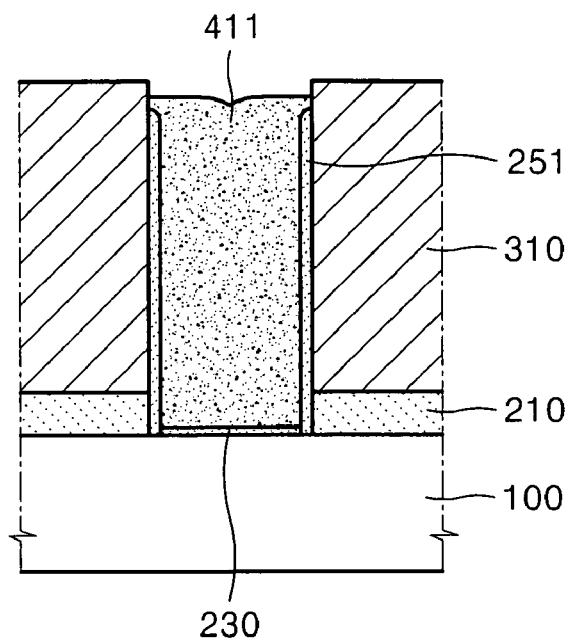

Referring to FIG. 11, the first gate layer 410 is patterned, thereby forming a first gate 411. The first gate layer 410 is overall-etched or polished using, for example, an etch back process or chemical mechanical polishing (CMP) process, to expose the upper surface of the sacrificial layer pattern 310 and to fill the trench 311 of the sacrificial layer pattern 310, thereby forming the first gate 411 on the third dielectric layer 230.

Figure 12:
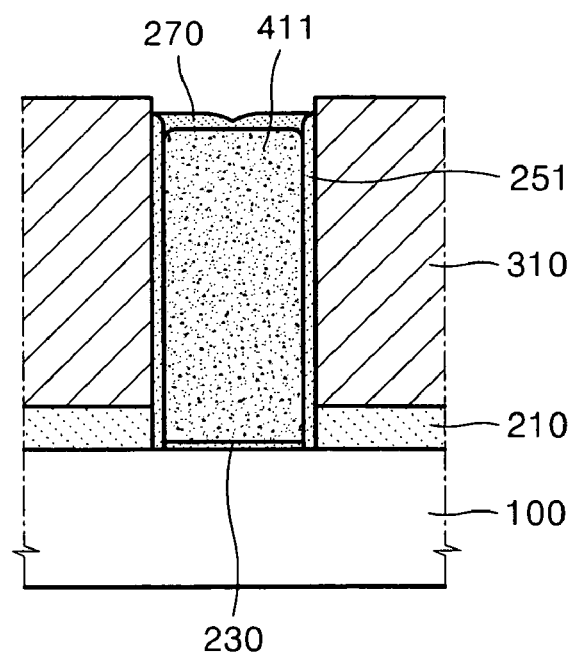

Referring to FIG. 12, a protecting layer 270 is formed on the first gate 411 to cover and protect the first gate 411. The protecting layer 270 is formed using an insulating material having an etch selectivity with respect to the insulating material of the sacrificial layer pattern 310, in order to protect the first gate 411 during a subsequent process for selectively removing the sacrificial layer pattern 310 used as a dummy damascene pattern. Specifically, a silicon oxide layer formed by oxidizing the exposed surface of the first gate 411 may be used as the protecting layer 270.

Figure 13:
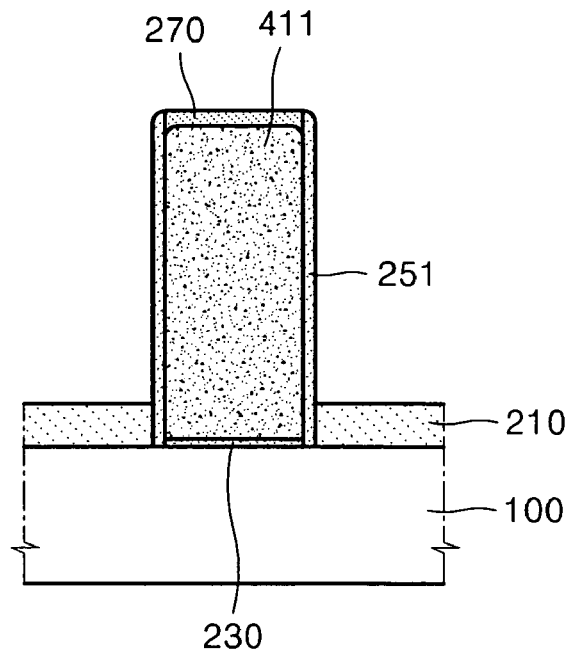

Referring to FIG. 13, the sacrificial layer pattern 310 is selectively removed. The sacrificial layer pattern 310 is selectively removed using an etch selectivity difference between the first dielectric layer 210 and the sacrificial layer pattern 310. The etch process may be performed to realize a relatively high etch selectivity in order to prevent damage to the first dielectric layer 210 underneath.

The sacrificial layer pattern 310 used to perform a damascene process is selectively removed, thereby forming a structure including the first gate formed on the main gate dielectric layer of the third dielectric layer 230 having a relatively thin thickness on the semiconductor substrate 100, and the first dielectric layer 210 having a relatively thick thickness formed on both portions of the semiconductor substrate 100 beside the first gate. The structure may be formed using the damascene process as described above, but may be also formed using any other modified methods. Based on the structure in which the first gate 411 is formed as above, an auxiliary second gate is formed on the first dielectric layer 210 having a relatively thick thickness.

FIGS. 14 through 20 are schematic sectional views illustrating a method of forming the second gate according to an embodiment of the present invention.

Figure 14:
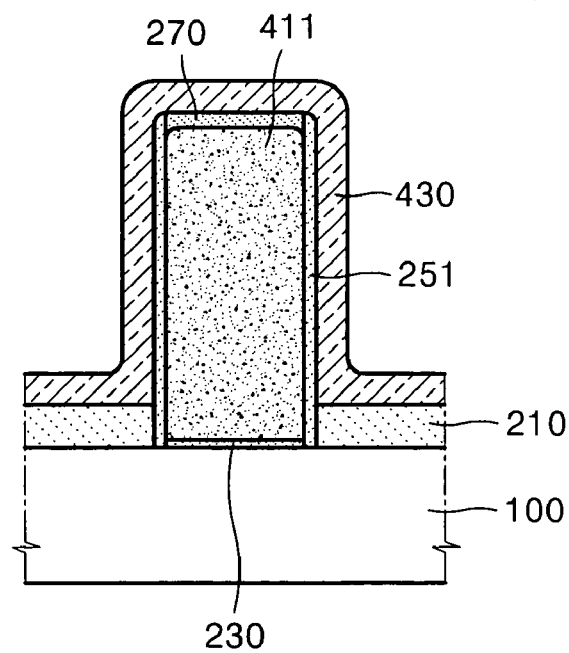

Referring to FIG. 14, a second gate layer 430 is formed on the first dielectric layer 210 to cover the first gate 411. That is, the second gate layer 430 covering the protecting layer 270 on the first gate 411, the inner spacers 251 on the sidewalls of the first gate 411, and the first dielectric layer 210 is formed by depositing a conductive material to form a gate. The second gate layer 430 may be composed of various conductive materials. For example, the second gate layer 430 may be formed by depositing conductive polysilicon.

Figure 15:
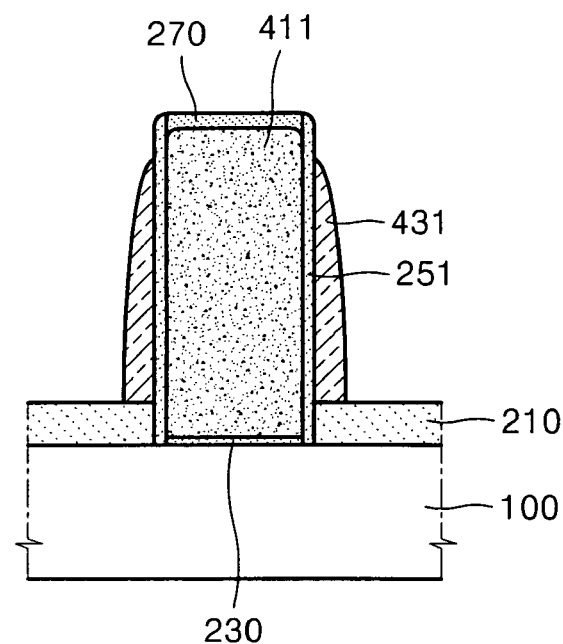

Referring to FIG. 15, steps for patterning second gates 431 will be described. Specifically, the second gate layer 430 is etched by a spacer etch method, for example, an anisotropic dry etch method, thereby forming the second gates 431 remaining on the sidewalls of the first gate 411 with a spacer shape. The etch process is performed to expose at least the upper surface of the first dielectric layer 210 and/or the upper surface of the protecting layer 270. Thus, the second gates 431 as a sidewall gate with a shaper shape are formed on the sidewalls of the first gate 411 as a main gate. The second gates 431 on both sidewalls of the first gate 411 are patterned by deposition and etch processes to have substantially equal widths.

Figure 16:
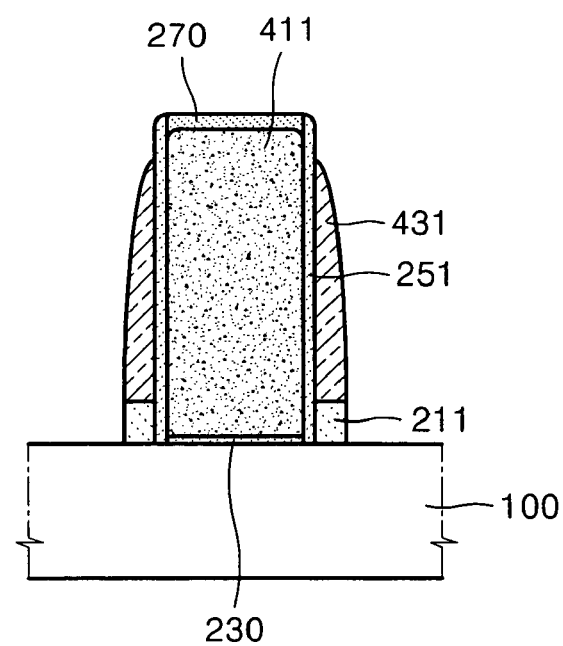

Referring to FIG. 16, the portion of the first dielectric layer 210 exposed by the second gates 431 is selectively removed, thereby forming a sidewall gate dielectric layer 211. An exposed portion of the first dielectric layer 210 except for the portion of the first dielectric layer 210 disposed below the second gates 431 is selectively removed, thereby exposing the semiconductor substrate 100 underneath. Thus, a sidewall gate dielectric layer 211 as a portion of the first dielectric layer 210 remaining below the second gates 431 and having a relatively thick thickness, and a main gate dielectric layer 230 as a portion of the third dielectric layer 230 remaining below the first gate 411 and having a relatively thin thickness are formed. The gate dielectric layers 230 and 211 have different thicknesses.

Since the second gates 431 substantially function as an etch mask, the patterned first dielectric layer portion, that is, the sidewall gate dielectric layer portion 211 is patterned to be self-aligned with the second gates 431. Thus, the sidewall gate dielectric layer 211 is patterned with substantially equal widths on both sides of the third dielectric layer 230.

After the gate dielectric layers 230, 211 and the gates 411, 431 are formed as described above, subsequent formation processes for a transistor, for example, a process of forming source/drains and a process of forming an electrode will be performed, thereby completing the formation of a transistor.

Figure 17:
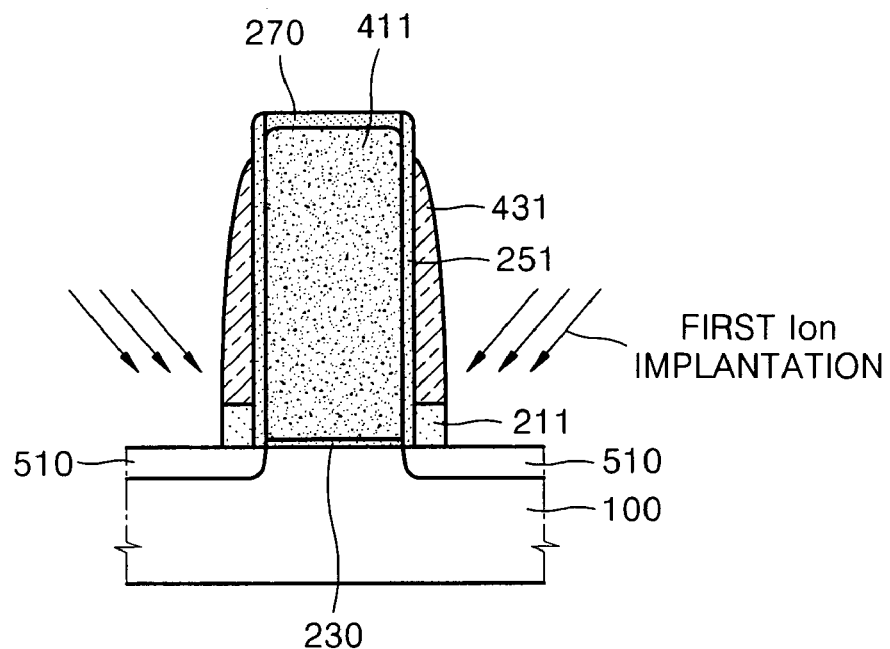

Referring to FIG. 17, a first ion implantation process is performed for the source/drain. Specifically, the first ion implantation is performed on the exposed semiconductor substrate 100 to implant impurities, using the second gates 431 and the sidewall gate dielectric layer 211 underneath as ion implantation masks. The first ion implantation process is performed to form a first impurity layer 510 to constitute a source/drain, for example, a lightly doped drain (LDD) layer. The ion implantation process to form the LDD layer may use an inclined ion implantation process. The first impurity layer 510 may be formed of an $n^-$-type or $p^-$-type impurity layer.

Alternatively, the first ion implantation process may be performed using a pocket ion implantation process to form a pocket impurity layer (not shown) attached to the source/drain. The pocket ion implantation process may be a process of implanting dopants having opposite conductivity type to impurities or dopants actually implanted during an ion implantation process for the source/drain. Further, the first ion implantation process may include the ion implantation process for the LDD, and the pocket ion implantation process.

Figure 18:
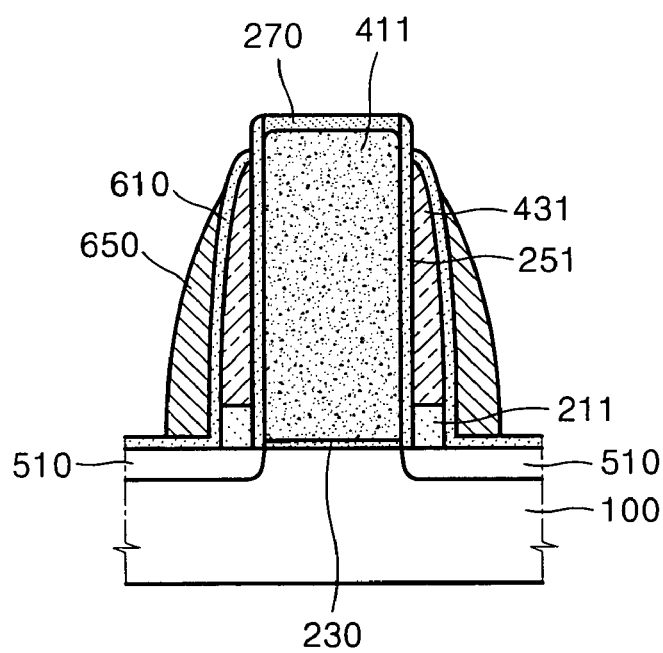

Referring to FIG. 18, outer spacers 610, 650 are formed on the sidewalls of the second gates 431. Specifically, a first outer spacer layer 610 and a second outer spacer layer 650 are formed by deposition to cover the sidewalls of the second gates 431. The first outer spacer layer 610 and the second outer spacer layer 650 are formed by depositing different insulating materials respectively, and then, by spacer-etching, for example, anisotropically dry-etching, thereby forming the spacers 610, 650. The first outer spacer layer 610 may be formed with a liner shape, and may be formed to include a silicon oxide layer or a silicon nitride layer. The second outer spacer layer 650 may be formed with a thicker thickness than that of the first outer spacer layer 610, and may be formed to include a silicon nitride layer or a silicon oxide layer. The spacer etch process may be performed by anisotropically etching the second outer spacer layer 650 to expose the first outer spacer layer 610.

Figure 19:
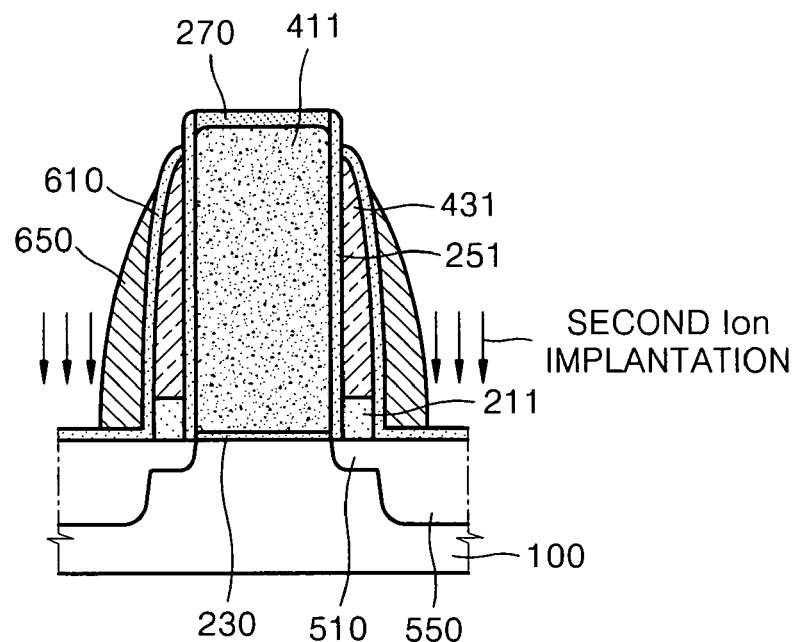

Referring to FIG. 19, a second ion implantation process is performed for the source/drain. The second ion implantation is performed on the exposed semiconductor substrate 100 to implant impurities, using the outer spacers 610, 650 as ion implantation masks. The second ion implantation process forms a second impurity layer 550, thereby constituting the source/drain along with the first impurity layer 510. The second impurity layer 550 may be formed of an $n^+$-type or $p^+$-type impurity layer. Then, an annealing process may be performed to activate the source/drain.

Figure 20:
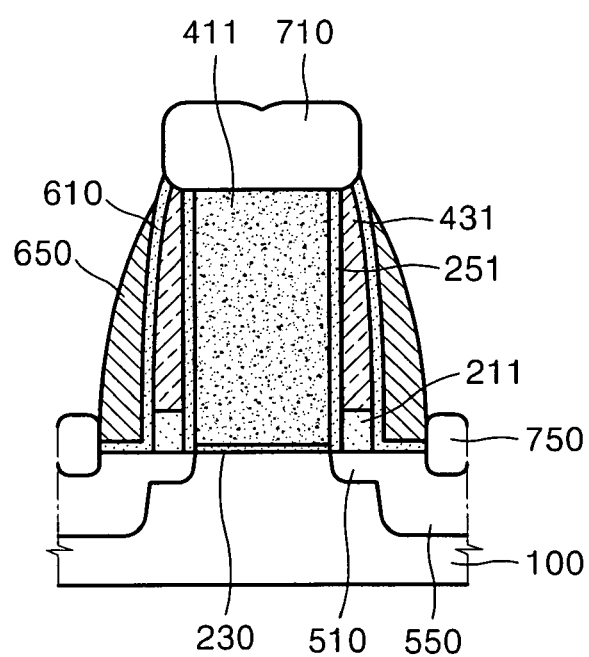

Referring to FIG. 20, steps are performed to form a gate electrode 710 and source/drain electrodes 750. For example, after exposing the gates 411, 431 and the source/drain of the semiconductor substrate 100, a silicide process is performed, thereby forming the gate electrode 710 and the source/drain electrodes 750. The silicide process may be performed as a self-aligned silicide process.

For example, after upper surfaces of the first gate 411 and/or the second gates 431 are selectively exposed, and the source/drain of the semiconductor substrate 100 are selectively exposed, a metal layer is deposited. Then, after an annealing process is performed for a selective silicide reaction, the metal layer portion, which is remaining without the silicide reaction, is selectively removed, thereby forming the gate electrode 710 and the source/drain electrodes 750.

The gate electrode 710 may be formed to connect with all of the first gate 411 and the second gates 431, but in some cases, may be formed to connect with only the first gate 411. In this case, the second gates 431 are insulated from the first gate 411 by the inner spacers 251 and the like, but are applied with a coupling voltage by the voltage applied to the first gate 411. Thus, the second gates 431 come to actually operate by the coupling voltage.

The silicide process is effective in the case that the first and/or the second gates 411, 431 are formed of silicon group material such as amorphous silicon or polysilicon, and the silicide process may be omitted in the case that the gates 411, 431 are formed of-metal gates.

The transistor structure as shown in FIG. 20 is configured such that the third dielectric layer 230 as the main gate dielectric layer is formed on the channel below the first gate 411 as the main gate, and the first dielectric layer 211 as the sidewall gate dielectric layer is formed below the second gates 431 formed on the sidewalls of the first gate 411 as the sidewall gate. The first dielectric layer 211 is thicker than the third dielectric layer 230.

Since the transistor structure is configured such that the relatively thin gate dielectric layer is formed on the channel region, and the relatively thick dielectric layer is formed on the source/drain, Miller capacitance interfering with high-speed operation of the device can be reduced. Further, leakage current to the gates from the source/drain can be reduced. Since the pocket ion implantation profile or the LDD layer is disposed below the relatively thick dielectric layer, a short channel effect of the transistor can be effectively improved. Therefore, the structure can contribute to effectively realizing device scaling-down.

The embodiment of the present invention described above can be modified to provide a structure in which the first gate and the second gates directly contact and are connected to each other, as opposed to the structure in which the first gate 411 and the second gates 431 are separated by the inner spacers 251.

FIGS. 21 through 27 are schematic sectional views illustrating a method of fabricating a transistor having a gate dielectric layer of partial thickness difference by a first modified example according to an embodiment of the present invention.

Figure 21:
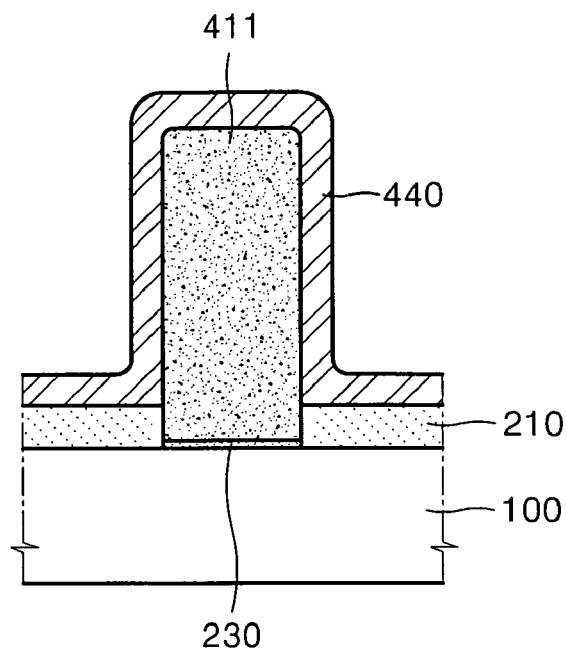
FIGS. 21 through 27 are schematic sectional views illustrating a transistor having a gate dielectric layer of partial thickness difference and a method of fabricating the same in a first modified example according to an embodiment of the present invention.

Referring to FIG. 21, a second gate layer 440 is formed on the first dielectric layer 210 to directly cover the first gate 411. Specifically, the protecting layer 270 on the upper surface of the first gate 411 and the inner spacers 251 on the sidewalls of the first gate 411 are selectively removed. The etch process for the selective removal may be performed to expose the surface of the first gate 411, and allow the underneath first dielectric layer 210 to maintain its thickness.

The second gate layer 440 covering the first gate 411 and the first dielectric layer 210 are formed by depositing a conductive material of the gate. The second gate layer 440 may be formed by depositing one of various conductive materials, for example, conductive amorphous silicon, polysilicon, or metal.

Figure 22:
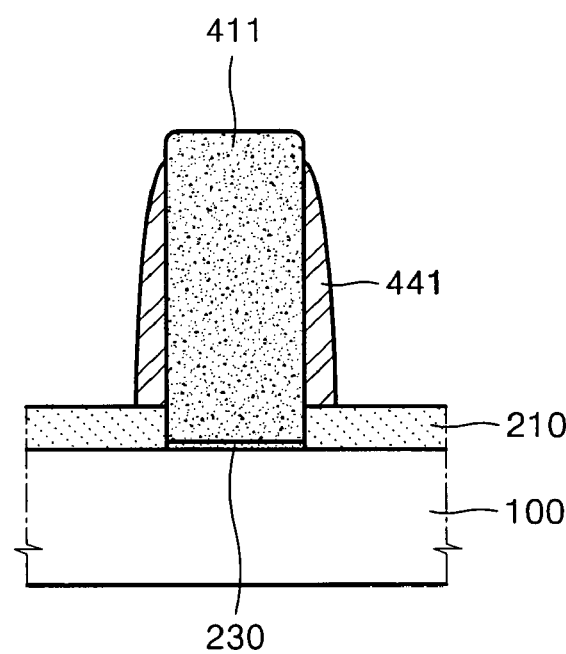

Referring to FIG. 22, steps for patterning the second gate 441 are schematically illustrated. Specifically, the second gate layer 440 is etched using a spacer-etch method, for example, anisotropic dry etch method, thereby forming the second gates 441 with a spacer shape, which remain on the sidewalls of the first gate 411. The etch process is performed to expose at least the upper surface of the first dielectric layer 210. Thus, the second gates 441 as a sidewall gate with a spacer shape are formed on the sidewalls of the first gate 411 as the main gate.

Figure 23:
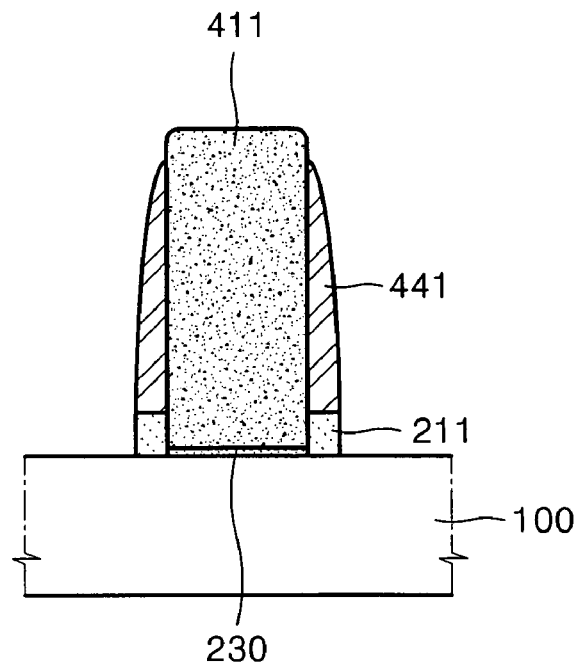

Referring to FIG. 23, the portion of the first dielectric layer 210 exposed by the second gates 441 is selectively removed, thereby forming a sidewall gate dielectric layer 211. As such, after the structure including the gate dielectric layers 230, 211, and the gates 411, 441 is formed, subsequent transistor formation processes, for example, source/drain formation processs and electrode formation process, are performed, thereby completing the formation of the transistor.

Figure 24:
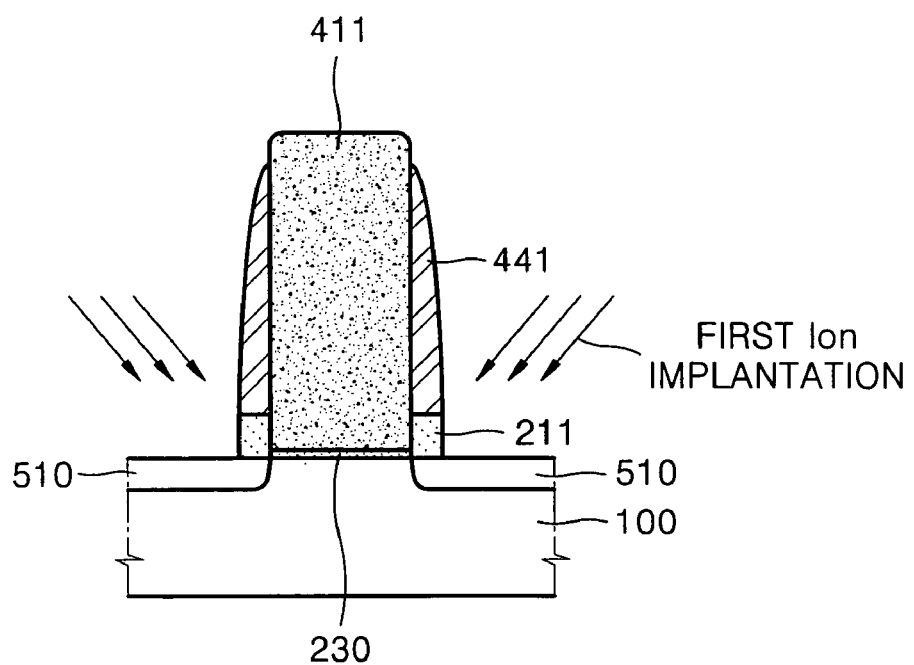

Referring to FIG. 24, a first ion implantation process for the source/drain is performed. Specifically, impurities are first ion-implanted on the exposed semiconductor substrate 100 using the second gates 441 and the underneath sidewall gate dielectric layer 211 as ion implantation masks. The first ion implantation process may be an ion implantation process of forming a first impurity layer 510 to constitute the source/drain, for example, a lightly doped drain (LDD) layer. Further, the first ion implantation process may be performed using a pocket ion implantation process to form a pocket impurity layer (not shown) attached to the source/drain. Further, the first ion implantation process may include the ion implantation process for the LDD, and the pocket ion implantation process.

Figure 25:
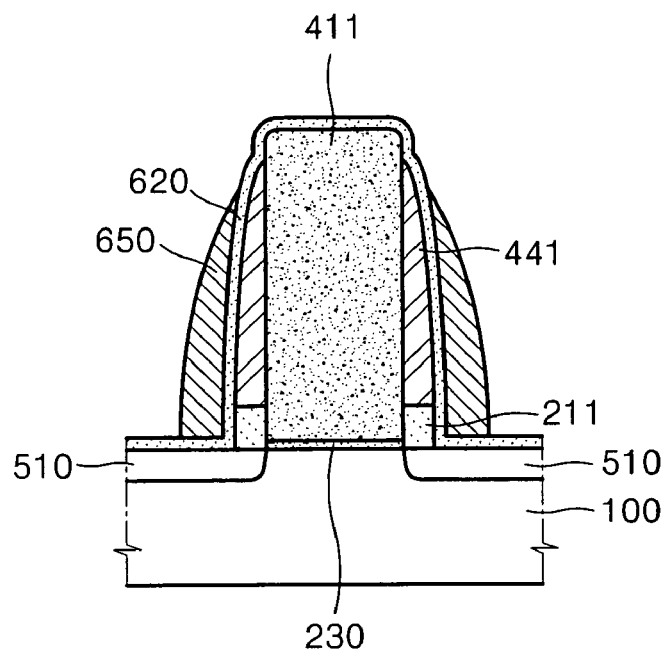

Referring to FIG. 25, outer spacers 620, 650 are formed on the sidewalls of the second gates 441. Specifically, after forming a first outer spacer layer 620 and a second outer spacer layer 650 to cover the second gates 441 and the first gate 411 by depositing different insulating materials, a spacer-etch, for example, anisotropic dry-etch process is performed, thereby forming the spacers 620, 650. The first outer spacer layer 620 may be formed with a liner shape, using a silicon oxidation process. The second outer spacer layer 650 may be formed with a thicker thickness than that of the first outer spacer layer 620, and may be formed to include a silicon nitride layer. The spacer-etch may include anisotropically etching the second outer spacer layer 650 to expose the first outer spacer layer 620.

Figure 26:
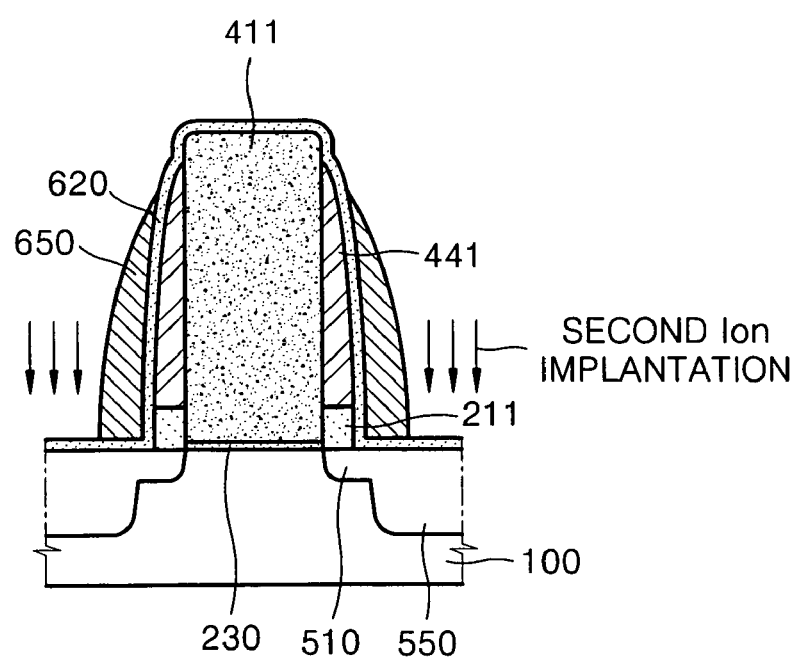

Referring to FIG. 26, a second ion implantation process for the source/drain is performed. Specifically, the second ion implantation is performed on the exposed semiconductor substrate 100 to implant impurities, using the outer spacers 620, 650 as ion implantation masks. The second ion implantation process forms a second impurity layer 550, thereby constituting the source/drain along with the first impurity layer 510. Then, an annealing process may be performed to activate the source/drain.

Figure 27:
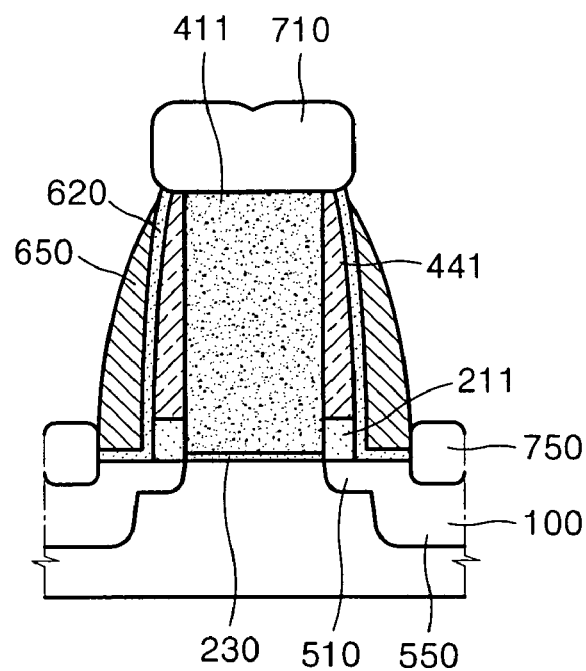

Referring to FIG. 27, steps for forming a gate electrode 710 and source/drain electrodes 750 are schematically illustrated. For example, after exposing the gates 411, 441 and the source/drain of the semiconductor substrate 100, a silicide process is performed, thereby forming the gate electrode 710 and the source/drain electrode 750. The silicide process may be performed using a self-aligned silicide process.

Further, a recess channel may be formed under the first gate 411 so as to extend the length of the channel according to an embodiment of the present invention.

Figure 28:
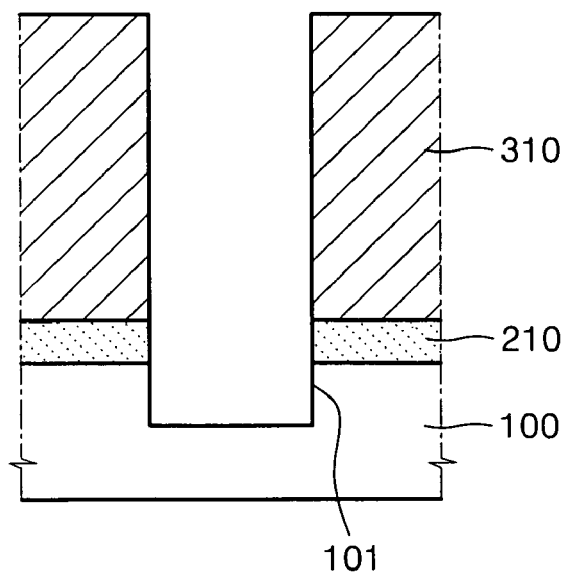
FIGS. 28 through 30 are schematic sectional views illustrating a transistor having a gate dielectric layer of partial thickness difference and a method of fabricating the same in a second modified example according to an embodiment of the present invention.
Figure 29:
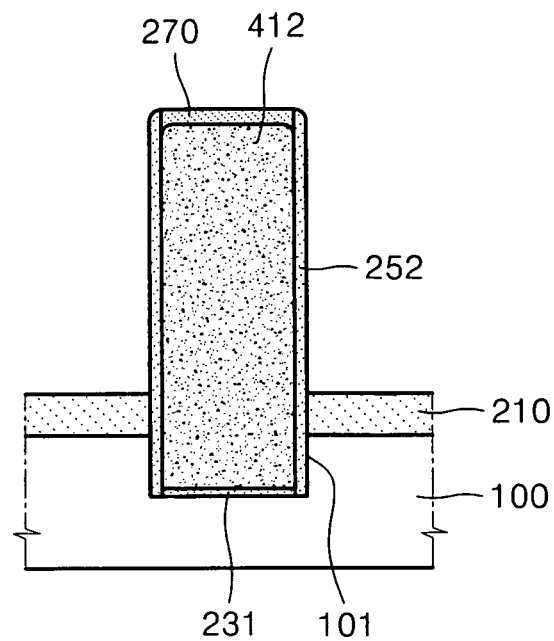
Figure 30:
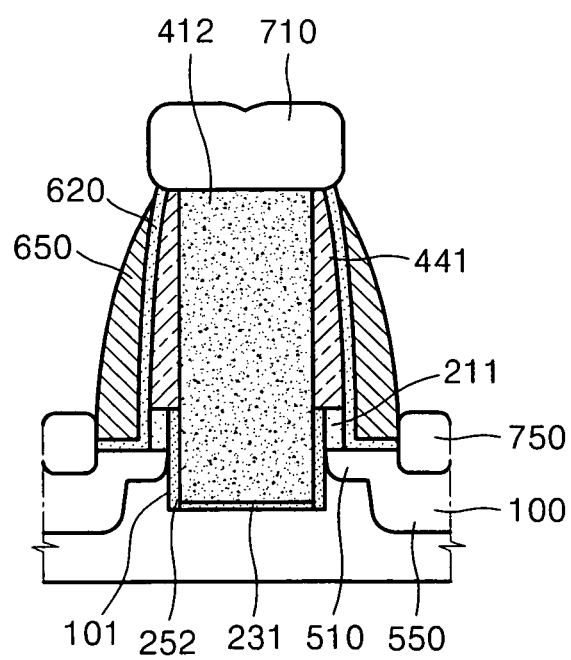

FIGS. 28 through 30 are schematic sectional views illustrating a method of fabricating a transistor having a gate dielectric layer of partial thickness difference by a second modified example according to an embodiment of the present invention.

Referring to FIG. 28, the method of fabricating a transistor according to a modified example of the present invention, which is characterized to form a recess channel below a first gate and extend a length of the channel, includes forming a first dielectric layer 210 on a semiconductor substrate 100, and patterning a sacrificial layer pattern 310 to form a trench 311 as described in reference to FIGS. 4 and 5. Then, the portion of the first dielectric layer 210 exposed by the trench 311 is selectively removed, thereby exposing a surface of the semiconductor substrate 100.

Then, referring to FIG. 29, the exposed semiconductor substrate 100 is selectively etched by a predetermined depth, using the sacrificial layer pattern 310 as a mask, thereby forming a recess groove 101. Then, as described in reference to FIGS. 6 through 13, an ion implantation process for threshold voltage (Vth) control is performed to form inner spacers 252 on the sidewalls of the sacrificial layer pattern 310, and a third dielectric layer 231 is formed on the exposed semiconductor substrate 100. Then, a first gate 412 is formed by the same process, and after a protecting layer 270 is formed, the sacrificial layer pattern 310 is removed.

The method may include an operation of forming the recess channel by employing the recess groove 101 in addition to the method of fabricating the transistor as described in reference to FIGS. 4 through 13.

Referring to FIG. 30, after the first gate 412 is formed to fill the inside of the recess groove 101, second gates 441 are formed, and after outer spacers 620, 650 are formed, a gate electrode 710 and source/drain electrodes 750 are formed as described in reference to FIGS. 21 through 27. The portion of the inner spacers 252 extending to cover the sidewalls of the recess groove 101 remains, thereby constituting a main gate dielectric layer disposed on a channel. That is, the main gate dielectric layers 252, 231 below the first gate 412 are formed to include the third dielectric layer 231 and the remaining portion of the inner spacers 252. Thus, the width of each of the inner spacers 252 is preferably formed equal to the thickness of the third dielectric layer 231.

After the first gate 412 filling the recess groove 101 is formed, a process of forming second gates and subsequent processes of forming a gate electrode 710 and the like may be performed by the same processes as described in reference to FIGS. 21 through 27. In this case, the inner spacers 252 are formed to extend and to remain between the first gate 412 and the second gates.

Further, in the embodiment of the present invention, before performing a silicide reaction process of forming the gate electrode, the method may further include partially etching the inner spacers 251 remaining between the first gate 411 and the second gates 431, and partially exposing the sidewalls of the first gate 411 and the second gates 431. The addition of the exposure operation as above increases the surface area of the gates 411, 431 involved with the silicide reaction, thereby providing the gate electrodes formed by the silicide reaction with thicker thickness.

Figure 31:
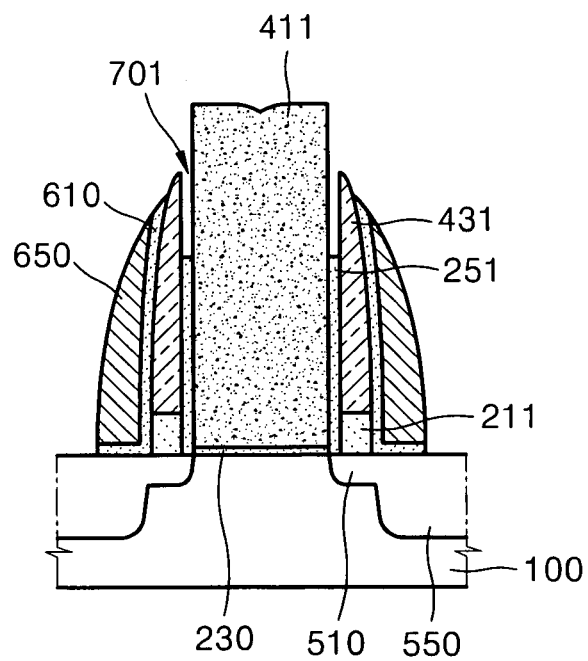
FIGS. 31 and 32 are schematic sectional views illustrating a transistor having a gate dielectric layer of partial thickness difference and a method of fabricating the same in a third modified example according to an embodiment of the present invention.
Figure 32:
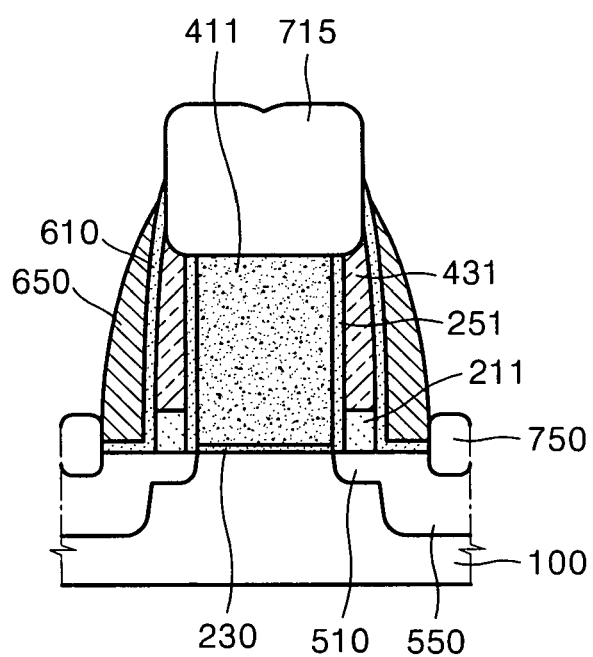

FIGS. 31 through 32 are schematic sectional views illustrating a method of fabricating a transistor having a gate dielectric layer of partial thickness difference by a third-modified example according to an embodiment of the present invention.

Referring to FIG. 31, after a first gate 411, second gates 431, outer spacers 610, 650, and the like are formed in the same processes as described in reference to FIGS. 4 through 19, the first gate 411 and the second gates 431 are made to expose their surfaces. Inner spacers 251 between the first gate 411 and the second gates 431 are partially more etched selectively, thereby forming an inter-gate groove 701 exposing upper sidewalls of the first gate 411 and the second gates 431.

Referring to FIG. 32, a self-aligned silicide process is performed, thereby forming a gate electrode 715 and source/drain electrodes 750. Since the exposed surface area of the first and second gates 411, 431 is further increased by the presence of the inter-gate groove 701, the contact area between a metal layer deposited on the gates 411, 431 and the gates 411, 431 is increased. Therefore, the silicide reaction is further actively processed, the gate electrode 715 with a thicker thickness is formed on the gates 411, 431.

The transistor fabricated as above according to the embodiments of the present invention is structured to include a semiconductor substrate, a first dielectric layer formed on the semiconductor substrate, a first gate overlapping on the first dielectric layer, inner spacers formed on the sidewalls of the first gate, second gates formed on the inner spacers and on the sidewalls of the first gate with a spacer shape, a second dielectric layer formed to be aligned with the second gates and having a thicker thickness than that of the first dielectric layer, and a source/drain formed in the portion of the semiconductor substrate exposed by the second gates.

The transistor may be structured to further include a gate electrode having a silicide layer connected to the gate and source/drain electrodes having a silicide layer connected to the source/drain. Further, the gate electrode may be selectively connected to the first gate, and the first gate may be insulated from the second gates by the inner spacers. The second gates on both sides of the first gate may be formed with equal widths with self-aligned to the first gate.

Further, the source/drain may be formed to include a first impurity layer formed by implanting ions using the equal-widths two second gates as masks, in which the width overlapping the second gate is controlled by the second gate, and a second impurity layer formed by implanting ions using the spacers attached to the second gates as masks, and aligned by the spacers.

The semiconductor substrate includes a recess groove for a recess channel overlapping the first gate, the inner spacers extend to cover the sidewalls of the recess groove, the first dielectric layer may be disposed at the bottom of the recess groove, and the first gate may fill the recess groove.

As described above, the transistor fabricated according to the present invention may be structured to include a relatively thin thickness gate dielectric layer portion substantially disposed on the channel of the transistor, relatively thick thickness gate dielectric layer portions disposed at both sides of the relatively thin thickness gate dielectric layer portion, and gates formed on the gate dielectric layer having different thicknesses in accordance with positions.

In the conventional fabrication method, the partial removal process of the gate material to form a notch accompanies difficulties in controlling etch process conditions, which may be further difficult with the scaling-down of devices further developed. However, in the embodiments of the present invention, the removal process of the gate material to form the notch can be omitted. Therefore, it can overcome the limitations in device scaling-down due to the problems involved with complicated control of the etch process. Accordingly, significant process development can be also expected in the aspects of a reliability and uniformity of devices.

According to the present invention, damage of a lower dielectric layer and an upper gate electrode, such as lifting occurring during the conventional partial removal process, and difficulties in processing during the conventional process of filling the notch, such as voids are not generated.

According to the present invention, since the gate dielectric layer is formed through the separate two steps, the limitation in forming the dielectric layer with the device scaling-down can be solved. Particularly, the width of the relatively thick thickness gate dielectric layer portion on the source/drain, Specifically, overlapping the LDD layer (that is, overlapping length) can be effectively controlled. Therefore, the short channel effect accompanied by the device scaling-down can be effectively solved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a transistor comprising:
    forming a gate dielectric layer including a main portion with a relatively thin thickness formed on a semiconductor substrate, and a sidewall portion with a relatively thick thickness formed on both sides of the main portion;
    forming a first gate overlapping the main portion of the gate dielectric layer;
    forming a second gate layer covering the sidewall portion of the gate dielectric layer exposed by the first gate, and covering the first gate;
    etching the second gate layer, thereby forming second gates patterned with a spacer shape on sidewalls of the first gate;
    selectively etching an exposed sidewall portion of the gate dielectric layer using the second gates as a mask, thereby forming a pattern of the gate dielectric layer to be aligned with the second gates, wherein the pattern of the gate dielectric layer has a width between sidewalls of the pattern of the gate dielectric layer that is the same as that of a bottom surface of the second gates; and
    forming a source/drain in a first portion of the semiconductor substrate exposed by the second gates.

2. The method according to claim 1, wherein forming the gate dielectric layer comprises:
    forming a first dielectric layer on the semiconductor substrate;
    forming a sacrificial layer pattern on the first dielectric layer to have a trench exposing a portion of the first dielectric layer;
    selectively removing the portion of the first dielectric layer exposed by the trench; and
    forming a second dielectric layer on a second portion of the semiconductor substrate exposed by removing the portion of the first dielectric layer, the second dielectric layer having a thinner thickness than that of the first dielectric layer.

3. The method according to claim 2, further comprising, before forming the second dielectric layer, selectively etching the second portion of the semiconductor substrate using the sacrificial layer pattern as mask, thereby forming a recess groove for a recess channel.

4. The method according to claim 2, wherein the first dielectric layer and the sacrificial layer pattern are formed of different insulating materials.

5. The method according to claim 4, wherein the sacrificial layer pattern is formed of a silicon nitride layer.

6. The method according to claim 2, wherein forming the first gate comprises:
    forming a first gate layer filling the trench;
    patterning the first gate layer to expose an upper surface of the sacrificial layer pattern; and
    selectively removing the sacrificial layer pattern.

7. The method according to claim 1, wherein forming the source/drain comprises:
    performing a first ion implantation on the first portion of the semiconductor substrate using the second gates as a mask;
    forming spacers on sidewalls of the second gates; and
    performing a second ion implantation on a third portion of the semiconductor substrate using the spacers as a mask.

8. The method according to claim 7, further comprising performing a pocket ion implantation on the first portion of the semiconductor substrate using the second gates as a mask.

9. The method according to claim 1, further comprising performing a self-aligned silicide process of forming electrodes to be connected with at least one of the first gate and second gates, and further forming the source/drain.

10. A method of fabricating a transistor comprising:
    forming a first dielectric layer on a semiconductor substrate;
    forming a sacrificial layer pattern on the first dielectric layer to have a trench exposing a portion of the first dielectric layer;
    selectively removing the portion of the first dielectric layer exposed by the trench;
    forming a second dielectric layer on a portion of the semiconductor substrate exposed by removing the portion of the first dielectric layer, the second dielectric layer having a thinner thickness than that of the first dielectric layer;
    forming a first gate filling the trench;
    selectively removing the sacrificial layer pattern exposed by the first gate, thereby exposing a remaining portion of the first dielectric layer;
    forming a second gate layer covering the exposed remaining portion of the first dielectric layer and the first gate;
    etching the second gate layer, thereby forming second gates patterned with a spacer shape on sidewalls of the first gate;

selectively etching the exposed remaining portion of the first dielectric layer using the second gates as a mask, thereby forming a pattern of the first dielectric layer to be aligned with the second gates; and forming a source/drain in a second portion of the semiconductor substrate exposed by the second gates.

11. The method according to claim 10, wherein forming the source/drain comprises:

performing a first ion implantation on the exposed second portion of the semiconductor substrate using the second gates as a mask;

forming spacers on sidewalls of the second gates; and performing a second ion implantation on an exposed third portion of the semiconductor substrate using the spacers as a mask.

12. The method according to claim 11, further comprising performing a pocket ion implantation on the exposed second portion of the semiconductor substrate using the second gates as a mask.

13. The method according to claim 10, further comprising, before forming the second dielectric layer, selectively etching the exposed portion of the semiconductor substrate using the sacrificial layer pattern as mask, thereby forming a recess groove for a recess channel.

14. The method according to claim 10, further comprising, before forming the second dielectric layer:

forming a third dielectric layer on the exposed semiconductor substrate;

performing an ion implantation for threshold voltage ($V_{th}$) control on a portion of the semiconductor substrate below the third dielectric layer; and selectively removing a portion of the third dielectric layer overlapping the semiconductor substrate.

15. The method according to claim 10, further comprising, before forming the second dielectric layer:

forming a third dielectric layer on the exposed semiconductor substrate to extend to cover sidewalls of the sacrificial layer pattern;

performing an ion implantation for threshold voltage ($V_{th}$) control on a portion of the semiconductor substrate below the third dielectric layer; and selectively removing a portion of the third dielectric layer overlapping the semiconductor substrate, thereby forming inner spacers on the sidewalls of the sacrificial layer pattern to include the remaining portion of the third dielectric layer.

16. The method according to claim 15, further comprising, before removing the sacrificial layer pattern, forming a protecting layer protecting the first gate along with the inner spacers.

17. The method according to claim 16, before forming the second gate layer, further comprising selectively removing the protecting layer and the inner spacers such that the second gate layer is formed on the first gate.

18. The method according to claim 16, wherein the second gate layer extends to cover the protecting layer and the inner spacers.

19. The method according to claim 18, further comprising:

exposing an upper surface of the gate after forming the source/drain, and selectively removing upper portions of the inner spacers, thereby partially exposing sidewalls of the first and second gates; and performing a self-aligned silicide process of forming a gate electrode to be connected with the first and second gates, and source/drain electrodes to be connected with the source/drain.

20. A method of fabricating a transistor comprising:

forming a gate dielectric layer including a main portion with a relatively thin thickness formed on a semiconductor substrate, and a sidewall portion with a relatively thick thickness formed on both sides of the main portion, wherein forming the gate dielectric layer comprises:

forming a first dielectric layer on the semiconductor substrate;

forming a sacrificial layer pattern on the first dielectric layer to have a trench exposing a portion of the first dielectric layer;

selectively removing the portion of the first dielectric layer exposed by the trench; and forming a second dielectric layer on a second portion of the semiconductor substrate exposed by removing the portion of the first dielectric layer, the second dielectric layer having a thinner thickness than that of the first dielectric layer;

forming a first gate overlapping the main portion of the gate dielectric layer;

forming a second gate layer covering the sidewall portion of the gate dielectric layer exposed by the first gate, and covering the first gate;

etching the second gate layer, thereby forming second gates patterned with a spacer shape on sidewalls of the first gate;

selectively etching an exposed sidewall portion of the gate dielectric layer using the second gates as a mask, thereby forming a pattern of the gate dielectric layer to be aligned with the second gates; and forming a source/drain in a first portion of the semiconductor substrate exposed by the second gates.

21. The method according to claim 20, wherein the first dielectric layer and the sacrificial layer pattern are formed of different insulating materials.

22. The method according to claim 21, wherein the sacrificial layer pattern is formed of a silicon nitride layer.

23. The method according to claim 20, wherein forming the first gate comprises:

forming a first gate layer filling the trench;

patterning the first gate layer to expose an upper surface of the sacrificial layer pattern; and selectively removing the sacrificial layer pattern.

* * * * *

UNITED STATES PATENT AND TRADEMARK OFFICE
CERTIFICATE OF CORRECTION

PATENT NO.       : 7,419,879 B2
APPLICATION NO.  : 11/329623
DATED            : September 2, 2008
INVENTOR(S)      : Byung-yong Choi et al.

Page 1 of 1

It is certified that error appears in the above-identified patent and that said Letters Patent is hereby corrected as shown below:

On the Title Page, Foreign Application Priority Data Item (30), please delete "10-2005-0015272" and insert --10-2005-0015372--

Signed and Sealed this
Fifth Day of April, 2011

David J. Kappos
*Director of the United States Patent and Trademark Office*